(12) United States Patent
Gatesman

(10) Patent No.: US 6,868,731 B1
(45) Date of Patent: Mar. 22, 2005

(54) DIGITAL OUTPUT MEMS PRESSURE SENSOR AND METHOD

(75) Inventor: Gary G. Gatesman, Indian Rocks Beach, FL (US)

(73) Assignee: Honeywell International, Inc., Morristown, NJ (US)

(*) Notice: Subject to any disclaimer, the term of this patent is extended or adjusted under 35 U.S.C. 154(b) by 68 days.

(21) Appl. No.: 10/718,133

(22) Filed: Nov. 20, 2003

(51) Int. Cl.[7] .............................................. G01L 7/00
(52) U.S. Cl. ...................................................... 73/714
(58) Field of Search ............. 73/700–756; 340/442–448

(56) References Cited

U.S. PATENT DOCUMENTS 3,978,731 A * 9/1976 Reeder et al. ................. 73/703

OTHER PUBLICATIONS

"High Temperature Accuracy Integrated Silicon Pressure Sensor for Measuring Absolute Pressure . . .," *Motorola, Inc., 2001,* MPXA6115A/D,(2001), 1–9 no month.

"Packing the Micro–machine," *Amkor Technology,* 1–6 no date.

* cited by examiner

Primary Examiner—William Oen
(74) Attorney, Agent, or Firm—Schwegman, Lundberg, Woessner & Kluth, P.A.

(57) ABSTRACT

A method and pressure-sensor system provide a digital-frequency output linearly proportional to a sensed pressure. The system comprises a MEMS pressure-sensing element to provide a pressure-sensing output and voltage-to-frequency converter provide the digital-frequency output. The pressure-sensor system may also comprise an amplifier to provide an output voltage linearly proportional to the pressure. A temperature sensor and temperature-compensation circuitry provide a temperature-compensation signal to the amplifier to at least partially offset the effects of temperature on the system. Some embodiments of the present invention comprise a microcontroller system comprising a microcontroller and an RF transmitter. The microcontroller may receive the digital-frequency output and may generate a notification signal when the sensed pressure is inside or outside a predetermined pressure range. The RF transmitter may transmit an RF signal to indicate that the sensed pressure is inside or outside the predetermined pressure range.

28 Claims, 4 Drawing Sheets

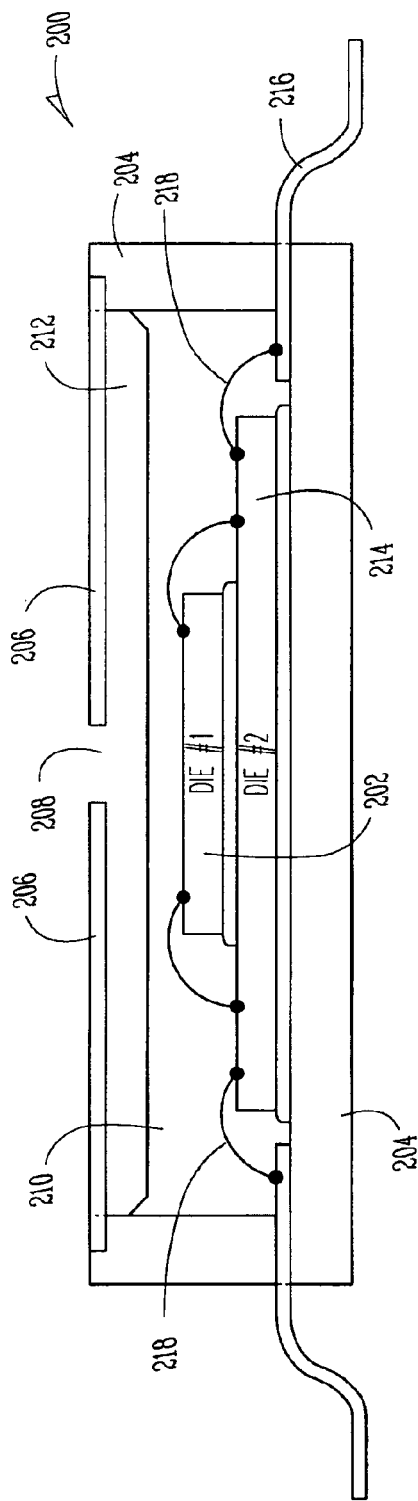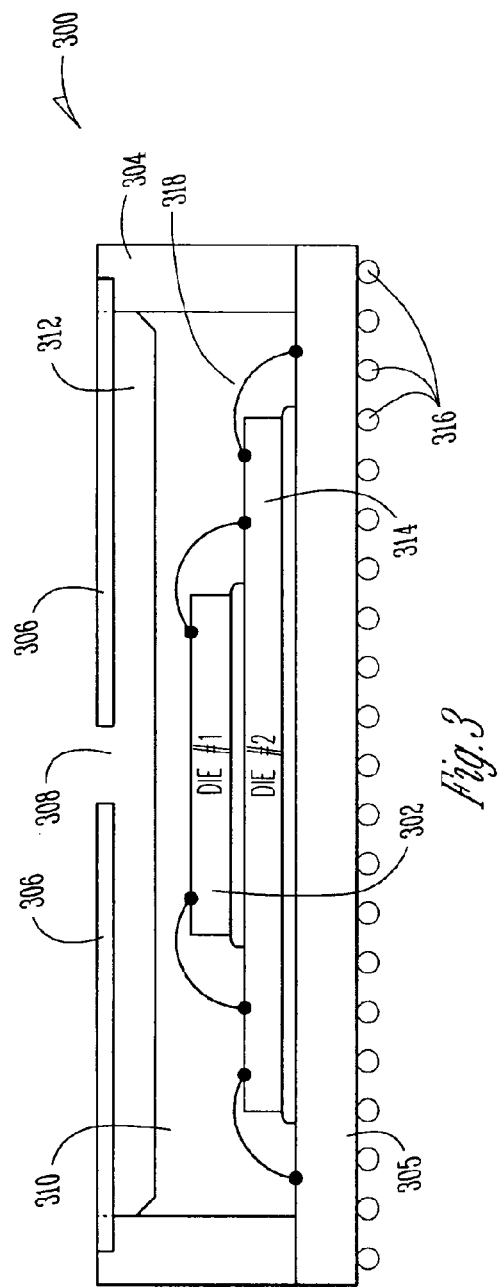

US 6,868,731 B1

DIGITAL OUTPUT MEMS PRESSURE SENSOR AND METHOD

TECHNICAL FIELD

Embodiments of the present invention pertain to electronic devices and systems, and in some embodiments, to pressure sensors and digital systems that sense pressure.

BACKGROUND

Conventional micro-electromechanical system (MEMS) based pressure sensors typically provide a non-amplified analog output voltage for measuring pressure. This low-level analog output voltage makes it difficult to integrate these conventional pressure sensors with digital systems, including microcontrollers and microprocessor based systems. To interface with such digital systems, additional circuitry must be designed and added. This increases cost and complexity. The low-level analog output voltage provided by such conventional sensors is also susceptible to noise and other interference reducing the accuracy of these conventional pressure sensors.

Some conventional pressure sensors include a digital interface, such as a RS-485 or RS-232 digital interface. These conventional pressure sensors are generally not suitable for many integrated circuit and on-die applications due to their large size and higher power consumption.

Thus there are general needs for improved pressure-sensing systems and methods. There are also general needs for pressure-sensing systems and methods that provide a digital-frequency output, are less susceptible to noise, and/or may be connected directly to microcontrollers and microprocessor based systems. There are also general needs for pressure-sensing systems and methods that have reduced circuitry, are smaller in size, and require less power. There are also general needs for pressure-sensing systems and methods that eliminate the need for analog designers to design and fabricate interface circuitry helping to reduce cost, increase accuracy, and reduce complexity.

SUMMARY

In some embodiments, a method and pressure-sensor system provide a digital-frequency output linearly proportional to a sensed pressure. The system comprises a micro-electomechanical system (MEMS) pressure-sensing element to provide a pressure-sensing output and voltage-to-frequency converter to provide the digital-frequency output. The pressure-sensor system may also comprise an amplifier to amplify the pressure-sensing output and provide an output voltage linearly proportional to the pressure.

In some embodiments, an error-compensated pressure-sensor system and method are provided. In these embodiments, a temperature sensor and temperature-compensation circuitry provides a temperature-compensation signal to the amplifier to at least partially offset the effects of temperature on the system. In these embodiments, offset-and-gain compensation circuitry provide offset-and-gain compensation signals to the amplifier for error compensation.

Some embodiments of the present invention further comprise a microcontroller system comprising a microcontroller and/or an RF transmitter. The microcontroller may receive the digital-frequency output and may generate a notification signal when the sensed pressure is inside or outside a predetermined pressure range. The RF transmitter may transmit an RF signal to indicate that the sensed pressure is inside or outside the predetermined pressure range. In some embodiments, the RF transmitter may transmit an RF signal to indicate the actual sensed pressure at periodic intervals in time.

BRIEF DESCRIPTION OF THE DRAWINGS

The appended claims are directed to some of the various embodiments of the present invention. However, the detailed description presents a more complete understanding of embodiments of the present invention when considered in connection with the figures, wherein like reference numbers refer to similar items throughout the figures and:

FIG. 2 illustrates packaging for a pressure-sensor system in accordance with embodiments of the present invention;

FIG. 3 illustrates packaging for a pressure-sensor system in accordance with other embodiments of the present invention;

DETAILED DESCRIPTION

The following description and the drawings illustrate specific embodiments of the invention sufficiently to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. The scope of embodiments of the invention encompasses the full ambit of the claims and all available equivalents of those claims.

Figure 1:
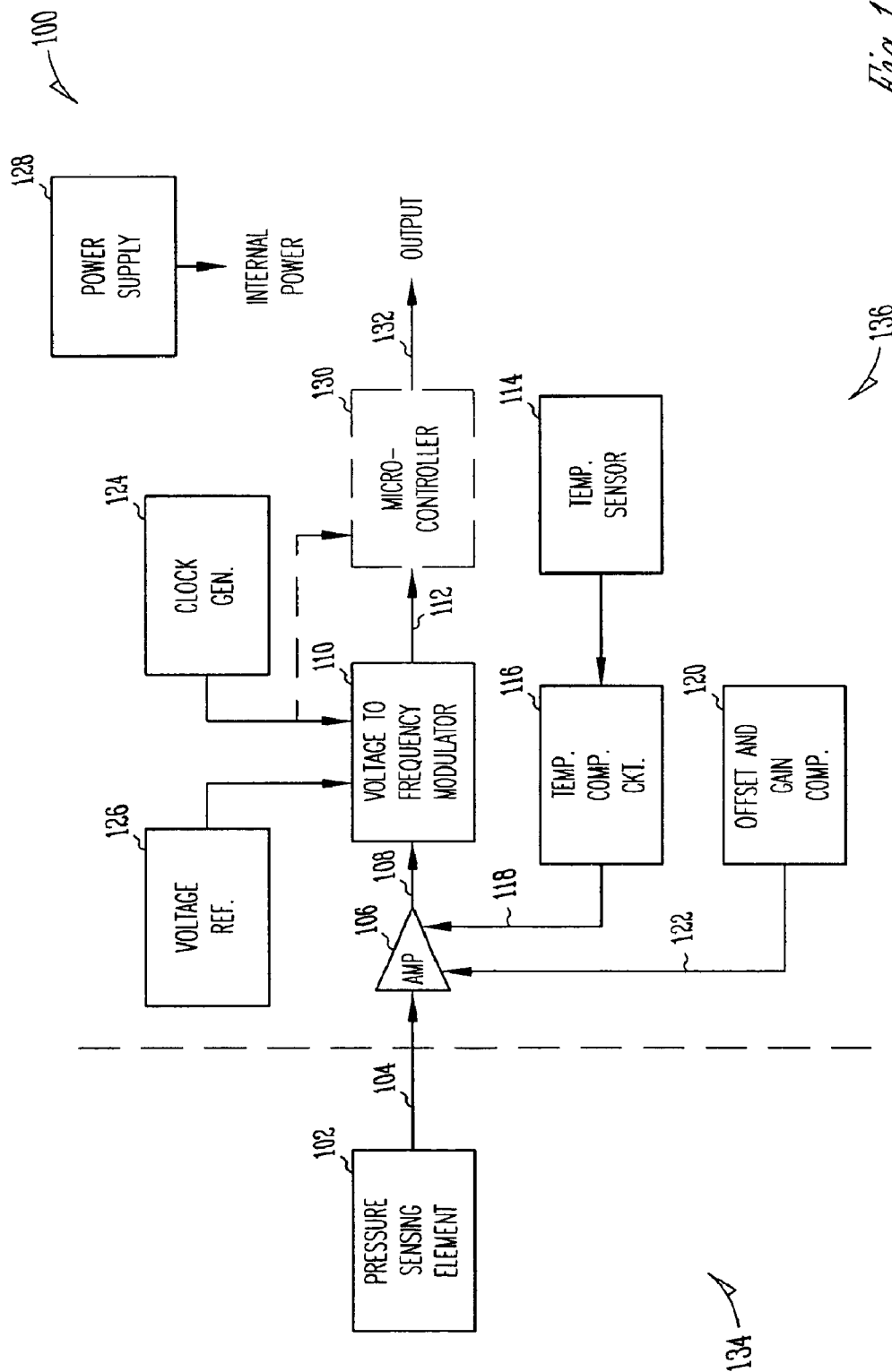
FIG. 1 is a functional block diagram of a pressure-sensor system in accordance with embodiments of the present invention.

FIG. 1 is a functional block diagram of a pressure-sensor system in accordance with embodiments of the present invention. Pressure-sensor system 100 comprises pressure-sensing element 102 to provide pressure-sensing output 104 proportional to a sensed pressure, and voltage-to-frequency converter 110 to provide digital-frequency output 112. Digital-frequency output 112 may be linearly proportional to the sensed pressure. Pressure-sensor system 100 may also comprise amplifier 106 to amplify pressure-sensing output 104 and provide output voltage 108 linearly proportional to the sensed pressure. Voltage-to-frequency converter 10 may receive output voltage 108 and provide digital-frequency output 112.

In some embodiments, pressure-sensor system 100 also comprises temperature sensor 114 and temperature-compensation circuitry 116. Temperature-compensation circuitry 116 may be responsive to the output of temperature sensor 114 to provide temperature-compensation signal 118 at least to amplifier 106. Temperature-compensation circuitry 116 may at least partially offset the temperature effects on the system and/or the various element of system 100 including amplifier 106. Voltage-to-frequency converter 110 may provide a maximum frequency output when the pressure on pressure-sensing element 102 senses a maximum pressure. Voltage-to-frequency converter 110 may also provide a minimum frequency output when the pressure on the pressure-sensing element senses a minimum pressure. The minimum pressure may be substantially zero.

In some embodiments, pressure-sensor system 100 also comprises offset-and-gain compensation circuitry 120 to provide offset-and-gain compensation signals 122 to amplifier 106. In response to offset-and-gain compensation signals 122, amplifier 106 may provide substantially a zero-voltage output at a minimum or a predetermined pressure. In further response to offset-and-gain compensation signals 122, amplifier 106 may provide a predetermined maximum output voltage at a maximum pressure or another predetermined pressure.

In some embodiments, pressure-sensor system 100 also comprises clock-generating circuitry 124 to provide a clock signal to voltage-to-frequency converter 110 for use in generating digital-frequency output 112. Pressure-sensor system 100 may also comprise voltage-reference circuitry 126 to provide a voltage reference to the voltage-to-frequency converter 110 for further use in generating the digital-frequency output 112. Pressure-sensor system 100 may also comprise power-supply circuitry 128 to provide power to pressure sensing element 102, amplifier 106, voltage-to-frequency converter 110, clock-generating circuitry 124, voltage-reference circuitry 126, temperature sensor 114, temperature-compensation circuitry 116, and/or offset-and-gain compensation circuitry 120.

In some embodiments, clock-generating circuitry 124, voltage-reference circuitry 126 and/or power-supply circuitry 128 are located off-die. In some embodiments, these elements may be part of a microcontroller system discussed in more detail below.

In some embodiments, pressure-sensing element 102 comprises a micro-electomechanical system (MEMS) pressure-sensing element. The MEMS pressure-sensing element may be fabricated within semiconductor die 134. The sensed pressure may deform die 134 and pressure-sensing element 102 may provide either a capacitive or resistive output change in response to the sensed pressure, although the scope of the invention is not limited in this respect. This output may be amplified by amplifier 106. In some embodiments, pressure-sensing element 102 may comprise a MEMS strain gauge, although the scope of the invention is not limited in this respect.

In some embodiments, amplifier 106, voltage-to-frequency converter 110, clock-generating circuitry 124, voltage-reference circuitry 126, temperature-compensation circuitry 116, and offset-and-gain compensation circuitry 120 may be fabricated on single (e.g., monolithic) semiconductor die 136. Pressure-sensing element 102 may also be fabricated on single semiconductor die 136, although in some embodiments, pressure-sensing element 102 may be fabricated on separate semiconductor die 134.

In some embodiments, pressure-sensor system 100 comprises on-die microcontroller 130 to provide digital-serial output 132 although the scope of the invention is not limited in this respect. Digital-serial output 132 may be generated from digital-frequency output 112 and a clock signal. Digital-serial output 132 may comprise a digital word indicating the sensed pressure. In some embodiments, microcontroller 130 may have a digital serial interface, such as a serial-peripheral interface (SPI), a microwave or RF interface, or an inter-integrated circuit (I2C) interface to provide digital-serial output 132, although the scope of the invention is not limited in this respect.

In some alternative embodiments, microcontroller 130 may be a microcontroller system and may include, among other things, one or more integrated multi-function timers and input capture and compare registers. In these embodiments, microcontroller 130 may capture and measure the frequency of signal 112 to determine the sensed pressure.

In some embodiments, pressure-sensor system 100 provides digital-frequency output 112 to a microcontroller system (not illustrated in FIG. 1). The microcontroller system may determine the sensed pressure from digital-frequency output 112 and may generate a response signal for other system elements (not illustrated) when the sensed pressure is inside or outside a predetermined pressure range (e.g. too high, too low). Other system elements may be responsive to the response signal. In some embodiments, the microcontroller system and pressure-sensor system 100 are located on a single printed circuit board. In some embodiments, the microcontroller system may be fabricated on die 136 or may be located off die.

In some embodiments, pressure-sensor system 100 may detect an absolute pressure, although in other embodiments, two or more pressure-sensing elements 102 may be utilized to detect a pressure differential. In some embodiments, pressure-sensor system 100 may be used to detect pressure in washing machines, vacuum cleaners, HVAC systems, altimeters and tires. In some embodiments, pressure-sensor system 100 may be used in liquid-level detectors, blood-pressure meters, monitoring systems and gas-pressure detectors.

Although system 100 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, application specific integrated circuits (ASICs), and combinations of various hardware and logic circuitry for performing at least the functions described herein.

FIG. 2 illustrates packaging 200 for a pressure-sensor system in accordance with embodiments of the present invention. Packaging 200 may be suitable for packaging pressure-sensor system 100 (FIG. 1), although other packaging techniques may also be suitable. Packaging 200 may comprise package 204 and semiconductor die 202 mounted within package 204. Semiconductor die 202 may include a pressure-sensing element, such as pressure-sensing element 102 (FIG. 1) and may correspond to die 134 (FIG. 1). Packaging 200 may also comprise lid 206 having opening or hole 208 to allow a fluid, including a gas such as air or liquid such as water, to enter into cavity 212 of package 204. Pressure from the fluid may deform die 202 and the pressure-sensing element may provide an output in response to the deformation of die 202.

In some embodiments, packaging 200 further comprises coating 210 within cavity 212. Coating 210 may at least partially cover die 202. Coating 210 may be a silicone-gel coating, although other coatings are also suitable.

In embodiments, packaging 200 may further comprise an o-ring seal (not illustrated) around an opening or hole 208 to help prevent a liquid from escaping or leaking out In these embodiments, the pressure-sensor system may measure the pressure of the liquid.

In some embodiments, the pressure-sensing element 102 (FIG. 1) may be fabricated with first semiconductor die 202, and amplifier 106 (FIG. 1) and the voltage-to-frequency converter 110 (FIG. 1), among other elements, may be fabricated as part of second semiconductor die 214. The first and second die may be coupled together and located within package 204. In other embodiments, pressure-sensing element 102 (FIG. 1), amplifier 106 (FIG. 1) and voltage-to-frequency converter 10 (FIG. 1), among other elements, may be fabricated as part of a single semiconductor die located within package 204.

In some embodiments, package 204 may be a lead-frame package comprising lead frames 216 to couple the package to a circuit board although the scope of the present invention is not limited in this respect. In these embodiments, lead frames 216 may couple to the die with bond wires 218.

FIG. 3 illustrates packaging 300 for a pressure-sensor system in accordance with other embodiments of the present invention. Packaging 300 may be suitable for packaging pressure-sensor system 100 (FIG. 1), although other packaging techniques may also be suitable. In these embodiments, packaging 300 comprises die 302, which may correspond with die 202 (FIG. 2), lid 306, which may correspond with lid 206 (FIG. 2), opening or hole 308, which may correspond with opening or hole 208 (FIG. 2), coating 310, which may correspond with coating 210 (FIG. 2), cavity 312, which may correspond with cavity 212 (FIG. 2), and die 314, which may correspond with die 214 (FIG. 2). Packaging 300 may also include an o-ring seal (not illustrated) as discussed above.

Packaging 300 may be a surface-mount package comprising either a ceramic or laminate substrate 305 for attachment to a circuit board (not illustrated) with solder balls 316. Wire bonds 318 may couple the die to solder-balls 316. Packaging 300 may comprise dam 304 surrounding die 302 and die 314 and attached to substrate 305. Coating 310 may be held in by dam 304, at least before curing, and may at least cover the die 302.

Figure 4:
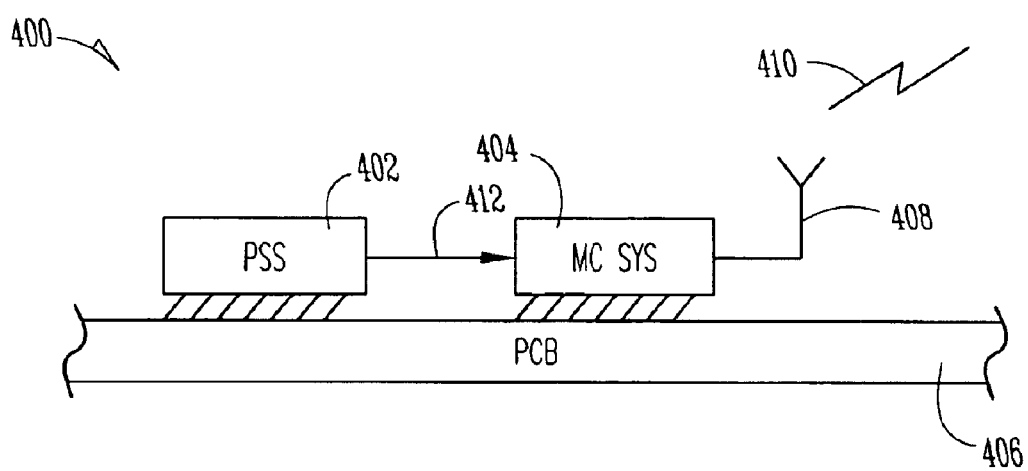
FIG. 4 illustrates a pressure-monitoring system in accordance with embodiments of the present invention.

FIG. 4 illustrates a pressure-monitoring system in accordance with embodiments of the present invention. Pressure-monitoring system 400 comprises pressure-sensing system 402 and microcontroller system 404. Pressure-sensing system 402 and microcontroller system 404 may be mounted on circuit board 406, although the scope of the invention is not limited in this respect. Pressure-sensor system 100 (FIG. 1) maybe suitable for use as pressure sensing system 402, although other pressure-sensor systems may also be suitable. Pressure sensing system 402 may be packaged in packaging such as packaging 200 (FIG. 2) or packaging 300 (FIG. 3), although other packaging is also suitable.

Pressure-sensing system 402 may comprise a pressure-sensing element, such as pressure-sensing element 102 (FIG. 1), to provide a pressure-sensing output proportional to a sensed pressure. Pressure-sensing system 402 may also comprise a voltage-to-frequency converter, such as voltage-to-frequency converter 110 (FIG. 1), to provide digital-frequency output 412 which may be linearly proportional to the sensed pressure.

Microcontroller system 404 may comprise a microcontroller and/or an RF transmitter. The microcontroller may receive the digital-frequency output, may determine the sensed pressure, and may generate a notification signal when the sensed pressure is inside or outside a predetermined pressure range. In some embodiments, the notification signal may be sent when a predetermined threshold is crossed and may represent that the pressure is low (e.g., outside a range), that the pressure is O.K. (e.g., inside a range)", or that the pressure is high (e.g., outside a range). In some embodiments, the microcontroller may generate a notification signal at periodic intervals in time to indicate an actual sensed pressure.

The RF transmitter may transmit RF signal 410 with antenna 408 in response to the notification signal. In some embodiments, the RF transmitter may transmit an RF signal to indicate an actual sensed pressure at periodic intervals in time. In embodiments, RF signal 410 may indicate that the sensed pressure is inside or outside the predetermined pressure range. In other embodiments, microcontroller system 404 may transmit the notification signal over a wireline connection to other system elements. Antenna 408 may comprise a directional or omnidirectional antenna, including, for example, a dipole antenna, a monopole antenna, a loop antenna, a microstrip antenna or other type of antenna suitable for reception and/or transmission of RF signals which may be transmitted by microcontroller system 404.

In some embodiments, microcontroller system 404 may include one or more integrated multi-function timers and input capture and compare registers. In these embodiments, microcontroller system 404 may capture and measure the frequency of signal 412 to determine the sensed pressure.

In some embodiments, microcontroller system 404 and pressure-sensor system 402 are located on single printed circuit board 406. In other embodiments, microcontroller system 404 and pressure-sensor system 402 are fabricated as a single monolithic semiconductor device.

In some embodiments, pressure-monitoring system 400 may comprise a tire pressure-monitoring system. In this embodiments, pressure-sensing system 402 and microcontroller system 404 receive power from a small battery (not illustrated). In these embodiments, the tire pressure-monitoring system may be located within a tire, such as within the valve stem, although the scope of the invention is not limited in this respect. In other embodiments, pressure-monitoring system 400 may comprise product pressure-monitoring system for use in washing machines, vacuum cleaners, HVAC systems, and altimeters. In other embodiments, pressure-monitoring system 400 may comprise a liquid-level detector, a blood-pressure meter or a gas-pressure detector.

Figure 5:
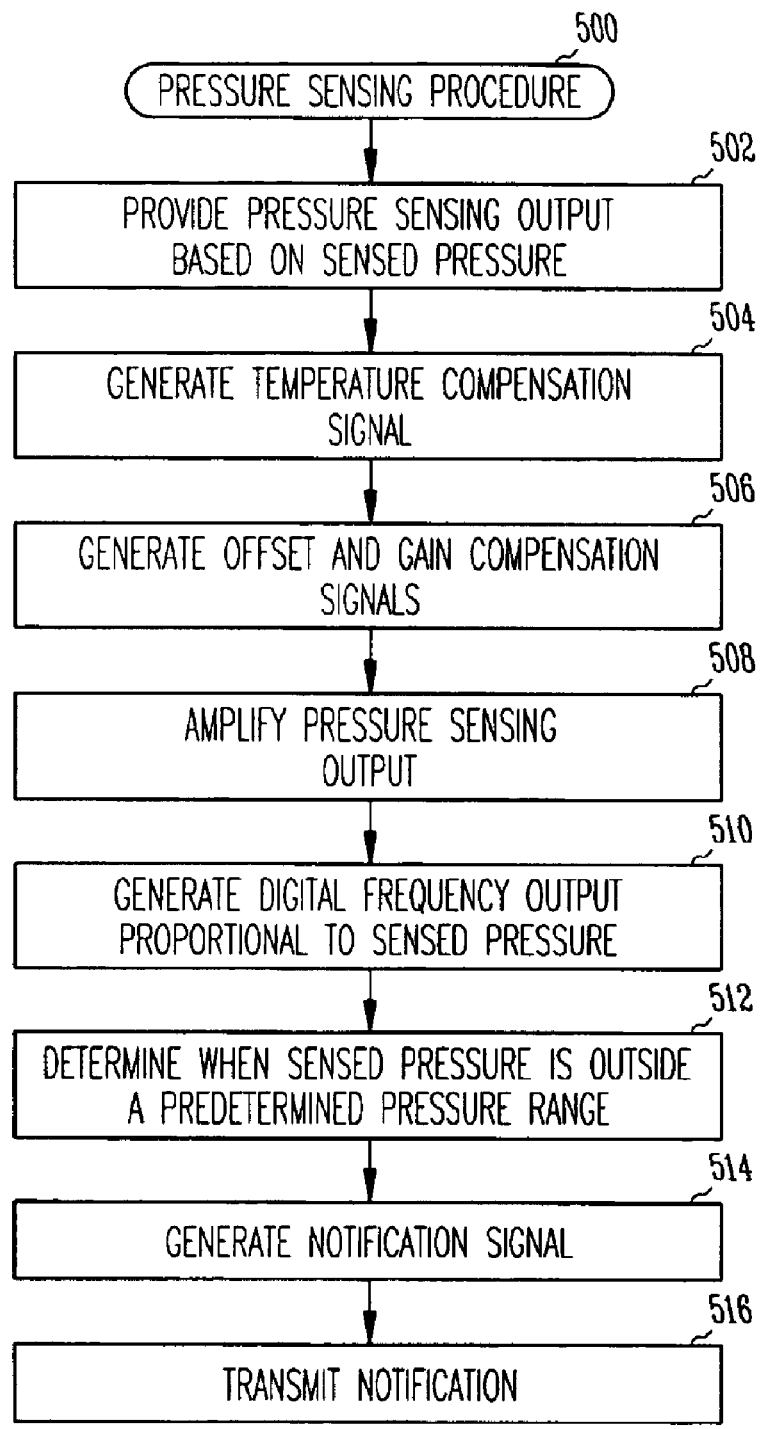
FIG. 5 is a flow chart of a pressure-sensing procedure in accordance with embodiments of the present invention.

FIG. 5 is a flow chart of a pressure-sensing procedure in accordance with embodiments of the present invention. Pressure-sensing procedure 500 may be performed by a pressure-sensor system, such as pressure-sensor system 100 (FIG. 1), and/or a pressure-monitoring system such as pressure-monitoring system 400 (FIG. 4), although other systems may also be suitable for performing procedure 500. Although the individual operations of procedure 500 are illustrated and described as separate operations, one or more of the individual operations may be performed concurrently and nothing requires that the operations be performed in the order illustrated.

In embodiments, pressure-sensing procedure 500 may generate a digital-frequency output substantially proportional to a sensed pressure. Operation 502 provides a pressure-sensing output proportional to a sensed pressure. Operation 502 may be performed by a pressure-sensing element, such as pressure-sensing element 102 (FIG. 1). In embodiments, the sensed pressure may deform a die comprising a pressure-sensing element. The pressure-sensing output may comprise a changing capacitive or resistive output, although the scope of the invention is not limited in this respect.

Operation 504 generates a temperature-compensation signal to at least in part offset temperature effects on the elements of the pressure-sensing system.

Operation 506 generates offset-and-gain compensation signals so that a substantially zero-voltage output at a minimum pressure may be provided. Operation 506 also generates offset-and-gain compensation signals so that a predetermined maximum output voltage may be provided at a maximum pressure.

Operation 508 amplifies the pressure-sensing output to provide an output voltage. The output voltage may be linearly proportional to the sensed pressure.

Operation 510 generates a digital-frequency output, which may be linearly proportional to the voltage provided in operation 508. The digital-frequency output may further be linearly proportional to the sensed pressure.

In some embodiments, procedure 500 may include operations 512 through 516. Operation 512 determines the sensed pressure based on the digital-frequency output and may also determine when the sensed pressure is inside or outside a predetermined pressure range. Operation 514 generates a notification signal when the sensed pressure is inside or outside the predetermined pressure range. Operation 516 wirelessly transmits the notification signal to another system element. Alternatively, operation 516 may transmit a notification signal over a wireline connection to other system elements.

It is emphasized that the Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims.

In the foregoing detailed description, various features are occasionally grouped together in a single embodiment for the purpose of streamlining the disclosure. This method of disclosure is not to be interpreted as reflecting an intention that the claimed embodiments of the subject matter require more features that are expressly recited in each claim. Rather, as the following claims reflect, inventive subject matter lies in less than all features of a single disclosed embodiment. Thus the following claims are hereby incorporated into the detailed description, with each claim standing on its own as a separate preferred embodiment.

What is claimed is:

1. A pressure-sensor system comprising:
   a micro-electo-mechanical system (MEMS) pressure-sensing element to provide a pressure-sensing output proportional to a sensed pressure;
   an amplifier to amplify the pressure-sensing output and provide an output voltage linearly proportional to the pressure; and
   a voltage-to-frequency converter to receive the output voltage and to provide a digital-frequency output linearly proportional to the pressure.

2. The pressure-sensor system of claim 1 further comprising:
   a temperature sensor; and
   temperature-compensation circuitry responsive to the temperature sensor to provide a temperature-compensation signal at least to the amplifier, wherein the temperature-compensation circuitry is to at least partially offset temperature effects on the system.

3. The pressure-sensor system of claim 1 wherein the voltage-to-frequency converter is to provide:
   a maximum frequency output when the pressure on the pressure-sensing element senses a maximum pressure; and
   a minimum frequency output when the pressure on the pressure-sensing element senses a minimum pressure.

4. The pressure-sensor system of claim 3 further comprising offset-and-gain compensation circuitry to provide offset-and-gain compensation signals to the amplifier, wherein in response to the offset-and-gain compensation signals, the amplifier provides substantially a zero-voltage output at the minimum pressure, and the amplifier provides a predetermined maximum output voltage at the maximum pressure.

5. The pressure-sensor system of claim 1 wherein:
   the pressure-sensing element is packaged within a semiconductor die, and
   the sensed pressure is to deform the die.

6. The pressure-sensor system of claim 5 wherein the pressure-sensing element comprises a MEMS strain gauge.

7. The pressure-sensor system of claim 1 wherein the pressure-sensing element provides one of either a capacitive or resistive output in response to the sensed pressure.

8. The pressure-sensor system of claim 4 further comprising clock-generating circuitry to provide a clock signal to the voltage-to-frequency converter for use in generating the digital-frequency output.

9. The pressure-sensor system of claim 8 further comprising voltage-reference circuitry to provide a voltage reference to the voltage-to-frequency converter for further use in generating the digital-frequency output.

10. The pressure-sensor system of claim 9 further comprising power-supply circuitry to provide power to at least one of the amplifier, the pressure-sensing element, the voltage-to-frequency converter, the clock-generating circuitry, the voltage-reference circuitry, the temperature sensor, the temperature-compensation circuitry, and the offset-and-gain compensation circuitry.

11. The pressure-sensor system of claim 9 wherein amplifier, the voltage-to-frequency converter, the clock-generating circuitry, the voltage-reference circuitry, the temperature-compensation circuitry, and the offset-and-gain compensation circuitry is fabricated on a single semiconductor die.

12. The pressure-sensor system of claim 11 wherein the pressure-sensing element is also fabricated on the single semiconductor die.

13. The pressure-sensor system of claim 11 further comprising an on-die microcontroller to provide a digital-serial output based on the digital-frequency output and the clock signal.

14. The pressure-sensor system of claim 13 wherein the digital-serial output comprises a digital word indicating the sensed pressure.

15. A pressure-sensor system comprising:
   a micro-electo-mechanical system (MEMS) pressure-sensing element to provide a pressure-sensing output proportional to a sensed pressure;
   a voltage-to-frequency converter to provide a digital-frequency output linearly proportional to the pressure based on the pressure-sensing output; and
   a microcontroller system, wherein the microcontroller system is to receive the digital-frequency output, is to determine the sensed pressure and is to generate a response signal for other system elements when the sensed pressure is either inside or outside a predetermined pressure range.

16. The pressure sensor system of claim 15 wherein the other system elements are responsive to the response signal.

17. The pressure sensor system of claim 15 wherein the microcontroller system and pressure-sensor system are located on a single printed circuit board.

18. The pressure sensor system of claim 15 wherein the microcontroller system and pressure-sensor system are fabricated on a single monolithic semiconductor die.

19. A pressure-sensor system comprising:
a package;
a micro-electo-mechanical system (MEMS) pressure-sensing element to provide a pressure-sensing output proportional to a sensed pressure;
a voltage-to-frequency converter to provide a digital-frequency output linearly proportional to the pressure based on the pressure-sensing output; and
a semiconductor die mounted within the package, the semiconductor die including the pressure-sensing element; and
a lid on the package having an opening to allow a fluid into the package, wherein the sensed pressure is to deform the die, and
wherein the pressure-sensing element is to provide either a capacitive or a resistive output in response to the deformation of the die.

20. The pressure-sensor system of claim 19 further comprising a silicone gel coating within a cavity of the package, the gel coating at least covering the die.

21. The pressure-sensor system of claim 20 wherein the package comprises lead-frames to couple with to circuit board.

22. The pressure-sensor system of claim 19 wherein the package is a surface-mount package comprising either a ceramic or laminate for attachment to a circuit board, the package comprising a dam surrounding the die and attached to the either ceramic or laminate.

23. The pressure-sensor system of claim 22 further comprising a silicone gel coating held by the dam, the gel coating at least covering the die.

24. The pressure-sensor system of claim 19 further comprising an o-ring seal around an opening in the lid to help prevent a liquid from escaping from the package, the pressure-sensor system to measure the pressure of the liquid.

25. The pressure-sensor system of claim 19 wherein the pressure-sensing element is fabricated with a first semiconductor die, and the amplifier and the voltage-to-frequency converter are fabricated as part of a second semiconductor die, the first and second die being coupled together and located within the package.

26. The pressure-sensor system of claim 19 wherein at least the pressure-sensing element, the amplifier and the voltage-to-frequency converter are fabricated as part of a single semiconductor die located within the package.

27. The pressure-sensor system of claim 19 wherein the temperature-compensation circuitry is to further offset the temperature effects on the pressure-sensing element and the voltage-to-frequency converter.

28. The pressure-sensor system of claim 19 wherein the temperature-compensation circuitry provide the temperature-compensation signal to help maintain a correspondence between a sensed pressure and the digital-frequency output for various temperatures.

* * * * *

UNITED STATES PATENT AND TRADEMARK OFFICE
CERTIFICATE OF CORRECTION

PATENT NO. : 6,868,731 B1
DATED : March 22, 2005
INVENTOR(S) : Gary G. Gatesman

It is certified that error appears in the above-identified patent and that said Letters Patent is hereby corrected as shown below:

Column 2,
Line 50, please delete "10" and insert -- 110 --.

Column 4,
Line 49, please delete "dcform dic" and insert -- deform die --.
Line 58, please delete "out" and insert -- out. --

Column 5,
Line 2, please delete "10" and insert -- 110 --.

Signed and Sealed this

Nineteenth Day of July, 2005

JON W. DUDAS
*Director of the United States Patent and Trademark Office*